(12) United States Patent
Bencher et al.

(10) Patent No.: US 10,983,444 B2
(45) Date of Patent: Apr. 20, 2021

(54) SYSTEMS AND METHODS OF USING SOLID STATE EMITTER ARRAYS

(71) Applicant: Applied Materials, Inc., Santa Clara, CA (US)

(72) Inventors: Christopher Dennis Bencher, Cupertino, CA (US); Joseph R. Johnson, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 500 days.

(21) Appl. No.: 15/964,018

(22) Filed: Apr. 26, 2018

(65) Prior Publication Data

US 2019/0332017 A1    Oct. 31, 2019

(51) Int. Cl.
*G03F 7/20* (2006.01)

(52) U.S. Cl.
CPC ...... *G03F 7/70391* (2013.01); *G03F 7/70041* (2013.01); *G03F 7/7055* (2013.01)

(58) Field of Classification Search
CPC . H01L 25/167; H01L 27/156; G03F 7/70391; H05B 45/10
See application file for complete search history.

(56) References Cited

U.S. PATENT DOCUMENTS

| | | | |
|---|---|---|---|
| 2005/0181314 A1 | 8/2005 | Gil et al. | |
| 2005/0282087 A1 | 12/2005 | Opower et al. | |
| 2009/0168035 A1* | 7/2009 | Kim, II | G03F 7/70391 355/53 |
| 2012/0249993 A1 | 10/2012 | Kajiyama et al. | |
| 2015/0370177 A1 | 12/2015 | Van Zwet et al. | |
| 2016/0381749 A1* | 12/2016 | Catalano | F21V 7/06 315/297 |

FOREIGN PATENT DOCUMENTS

WO    99-45436 A1    9/1999

* cited by examiner

*Primary Examiner* — Steven Whitesell Gordon
(74) *Attorney, Agent, or Firm* — Patterson & Sheridan, LLP (57) ABSTRACT

Embodiments of the present disclosure provide improved photolithography systems and methods using a solid state emitter device. The solid state emitter device includes an array of solid state emitters arranged in a plurality of horizontal rows and vertical columns. The variable intensity of each group of solid state emitters, for example an entire row or column of solid state emitters, is controllable for improved field brightness uniformity and stitching. Controlling the variable intensity includes, for example, varying the signal, such as voltage, that is applied to each of the rows of solid state emitters to attenuate the brightness from the middle of the array to the edges of the array to accommodate for overlapping exposures during photolithography processing.

18 Claims, 9 Drawing Sheets

SYSTEMS AND METHODS OF USING SOLID STATE EMITTER ARRAYS

BACKGROUND

Field

Embodiments of the present disclosure generally relate to apparatuses, systems and methods for processing one or more substrates, and more specifically to apparatuses, systems and methods for performing photolithography processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices at the prices demanded by consumers, new apparatuses and approaches are needed to precisely and cost-effectively create patterns on substrates, such as large area substrates.

SUMMARY

Embodiments of the present disclosure provide improved photolithography systems and methods using a solid state emitter device. The solid state emitter device includes an array of solid state emitters arranged in a plurality of horizontal rows and vertical columns. The variable intensity of each group of solid state emitters, for example an entire row or column of solid state emitters, is controllable for improved field brightness uniformity and stitching. Controlling the variable intensity includes, for example, varying the signal, such as voltage, that is applied to each of the rows of solid state emitters to attenuate the brightness from the middle of the array to the edges of the array to accommodate for overlapping exposures during photolithography processing.

In an embodiment, a solid state emitter device, comprising: a plurality of solid state emitters arranged in an array comprising a plurality of rows and a plurality of columns; a plurality of transistors, each transistor of the plurality of transistors being coupled to a solid state emitter of the plurality of solid state emitters in the array; and a plurality of common power rails including at least a first common power rail and a second common power rail, wherein the first common power rail is electrically coupled to a first subset of transistors of the plurality of transistors, and wherein the second common rail is electrically coupled to a second subset of transistors of the plurality of transistors; a plurality of imaging programs stored in a non-transitory memory of the imaging system and configured, when executed by a processor, to transmit a plurality of pulses to the solid state emitter device.

In an embodiment, an imaging system, comprising: a plurality of imaging programs stored in a non-transitory memory of the system and executable by a processor; a plurality of solid state emitters arranged in an array comprising a plurality of rows and a plurality of columns; a plurality of transistors, each transistor of the plurality of transistors is coupled to one of the plurality of solid state emitters; a plurality of common rails, wherein each common rail of the plurality of common rails is coupled to a subset of solid state emitters of the plurality of solid state emitters; and a pulsing source electrically coupled to the array and configured to, in response to execution of an imaging program of the plurality of imaging programs by the processor, transmit a plurality of sequential pulses to the plurality of common rails, wherein each pulse of the plurality of sequential pulses is associated with an intensity and a duration.

A method for using a solid state emitter device, comprising: transmitting, by a pulse source of an imaging system in response to execution of an imaging program by a processor, a first pulse to a first common rail of a plurality of common rails of a solid state emitter array using a first voltage for a first duration, wherein the first common rail is associated with a first subset of solid state emitters, wherein the first common rail transmits the pulse to the first subset of solid state emitters; and subsequent to transmitting the first pulse, transmitting, by the pulse source, based on the imaging program, a second pulse to a second common rail of the plurality of common rails using a second voltage for a second duration, wherein the second common rail is associated with a second subset of solid state emitters, wherein the second common rail transmits the pulse to the second subset of solid state emitters.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Embodiments of the present disclosure provide improved photolithography systems and methods using a solid state emitter device for operations including substrate patterning. Solid state emitter devices are microscopic (for example, less than about 100 μm at the largest dimension) light emitting diodes, in particular, the solid state emitters discussed herein emit electromagnetic radiation and may be used in light-emitting devices (LEDs), uLEDs, vertical-cavity surface-emitting lasers (VCSEL), and other devices. Various examples of solid state emitter devices include an array of solid state emitters arranged in a plurality of horizontal rows and vertical columns. Each solid state emitter may be associated with at least one pixel. In some embodiments, a plurality of sub-pixels may be associated with each pixel. Using the systems and methods discussed herein, an intensity of brightness of columns and/or rows of solid state emitters are made variable and controllable. In an embodiment, an entire row or column of solid state emitters (e.g., a subset of solid state emitters that spans a length or a width from edge-to-edge of the array's substrate), is controllable for improved field brightness uniformity and field stitching. Individual rows and/or columns, or groups of rows and/or columns, may be referred to generally herein as "subsets." Controlling the variable intensity of these arrays includes, for example, varying the signal (pulse), such as voltage, that is applied to each of the rows or columns of solid state emitters via a common power rail shared by some or all solid state emitters in a row or column. This control of intensity may be executed in order to attenuate the brightness from the middle of the array to the edges of the array to accommodate for overlapping exposures during photolithography processing.

As discussed herein, the attenuation of brightness refers to the reduction of brightness, for example, as an edge of an array of solid state emitters on a substrate may have less voltage applied such that is appears less bright than rows or columns located closer to a center of the array. Thus, attenuating the voltage transmitted to the solid state emitters during exposure of the photoresist-coated substrate means that less voltage may be applied to solid state emitters towards the edges of the substrate such that the brightness fades either in the north-south direction or in the east-west direction, as discussed in detail below, which promotes blending of the pixels. If pixels are not blended, then lines may be visible in the display, so it may be desirable to match the brightness between pixels and within pixels. If pixels are not blended, a viewer of the substrate may see an unevenness or non-uniformity, making the associated display defective. Thus, in some embodiments, an intensity of the dose may be decreased based upon a position of a row or a column to an edge of an array depending upon the scanning direction. In other embodiments, which may be combined, a time of the dose exposure may also be modulated, such that rows or columns near the edge may receive a dosage at the same or different amount as adjacent rows or columns but for a shorter time period.

The exposures discussed herein refer to the pulses of signal to an array or to a subset (portion) of an array of solid state emitters, during which time a substrate that may be coated with a photoresist is exposed to the array. These pulses may be referred to as doses, voltages, or as the application of current, and may occur at different intensities and for varying durations as discussed herein. The pulses may be transmitted to the array during a plurality of passes over the substrate on which the array is formed. As solid state emitters are activated during these passes, a substrate or batch of substrates in an imaging system may be patterned.

In some examples, regions of overlap may be formed during passes of one or more image projection apparatuses of an imaging system during carriage returns, which may be referred to as "passes" or "translations" or "stepping down" herein. A carriage return moves a substrate or moves a machine in which the substrate is disposed while the substrate remains stationary. This movement may be in a perpendicular direction relative to a direction of a first pass such that a second, different and in some cases overlapping, location for a second pass is created by the carriage return. Overlapping region or regions may be formed by multiple passes of a single image projection apparatus or by adjacent (different) image projection apparatuses. The overlap of these different passes reduces the risk of leaving large, undesired spaces in the patterned portion of the target substrate. However, this overlap also increases the risk of double exposure (which may be referred to as a double pass or as overlapping passes) in the overlapping regions, which can lead to undesirable features such as visible lines and an absence of fading/blending, which may also be referred to as field stitching. Visible lines and the absence of fading/blending renders the subject product defective. If subsequent passes over an already-exposed region are executed without lessening an intensity of the exposure since these overlapping regions may be receiving twice the dose of single-pass columns and rows. This undesired effect is in contrast to a desired blending of edges/fading of brightness towards edges of an array created by using the systems and methods discussed herein. In one example, a uLED array is moved over a substrate in a first pass, and there may subsequently be one or more bands of exposed areas caused by non-uniformities due to variation in solid state emitter intensity of the uLED array. If a band or bands appear after a pass due to under-exposure, a voltage on the corresponding section (e.g., a row) of the uLED can be increased. Similarly, if over-exposure is exhibited, a voltage on the corresponding section (e.g., a row) of the uLED can be decreased. Thus, the use of the common rails enables rail-by-rail adjustment of solid state emitter voltage to compensate for both under-exposure and over-exposure.

As discussed herein, a "common rail" is a power rail that is shared by two or more transistors, which may be adjacent transistors. By using common (shared) power rails for the solid state emitters as discussed herein, the pulses transmitted to the common power rails may be used to apply doses (expose) a single row or column at a time, since a plurality of solid state emitters along a row or a column may share a single common rail. Solid state emitters that have transistors (including gates) configured in an "on" setting will pass on the current from the rail, causing the solid state emitter to light up at varying levels of brightness, and solid state emitters coupled to the same common rail that have transistors (gates) configured in an "off" setting will not transmit the current from the common rail. Each common rail may have a varying dose (intensity and/or duration) applied during these pulses. One or more common rails may be pulsed at a time, and a single common rail may be pulsed more than once with the same or different transistors set to "on" during sequential pulses. Thus, the systems and methods discussed herein enables the attenuation of brightness and an improved brightness control of solid state emitter devices.

The systems and methods herein are advantageous in creating this blending among and between pixels, and are employed as discussed in exemplary embodiments herein. Each solid state emitter array comprises a plurality of rows and columns, and either the solid state emitters in each row or each column share a common power rail ("common rail") that transmits pulses to the solid state emitters in response to a transistor coupled to the common power rail receiving a pulse from a pulsing source. Each imaging program of a plurality of imaging programs is stored in the system comprises instructions that (1) determine which gates are to be "on" and which are to be "off" for each of a plurality of passes over the solid state emitter array and set the gates accordingly; (2) determine what pulses (intensity and duration) are to be applied to each common rail in sequential or simultaneous application of pulses to the solid state emitter array in one or more complete passes over a substrate during fabrication.

Figure 1A:
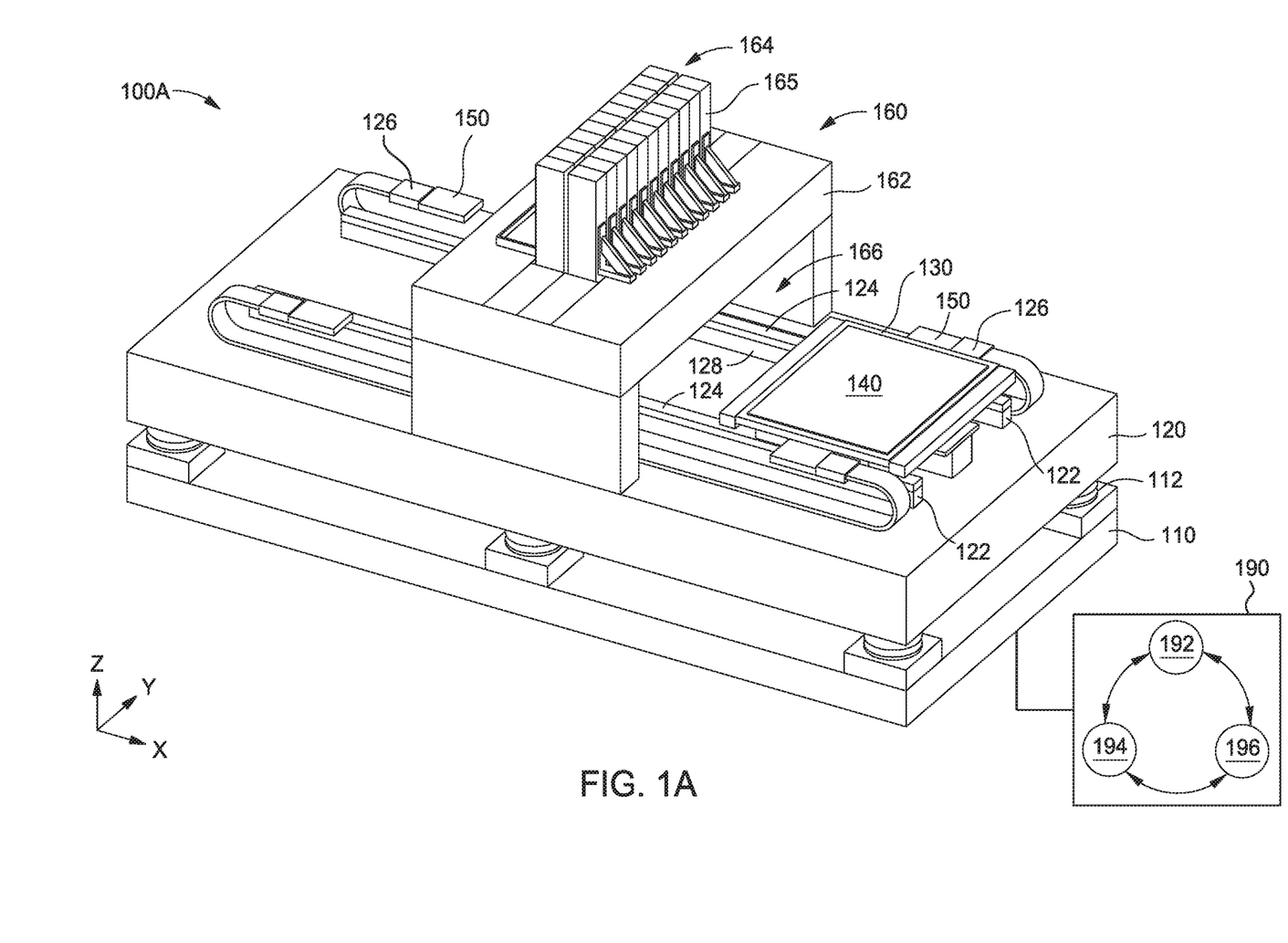
FIG. 1A is a perspective view of a photolithography system according to embodiments disclosed herein.

FIG. 1A is a perspective view of a photolithography system 100A according to embodiments disclosed herein. The system 100A includes a base frame 110, a slab 120, a stage 130, and a processing apparatus 160. The base frame 110 rests on the floor of a fabrication facility and supports the slab 120. A plurality of passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example, quartz, is used as part of a flat panel display. In other embodiments, the substrate 140 is made of other materials capable of being used as a part of the flat panel display. In some embodiments, the substrate 140 has a photoresist layer formed thereon which is sensitive to radiation. A positive photoresist includes portions of the photoresist, which, when exposed to radiation, are respectively soluble to a photoresist developer applied to the photoresist after the pattern is written into the photoresist. A negative photoresist includes portions of the photoresist, which, when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100A includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction as indicated by the coordinate system shown in FIG. 1A. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130, the encoder 126 is configured to provide location information to a controller 190.

In an embodiment, the processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIGS. 2A and 2B). In one embodiment, the processing unit 164 contains as many as 84 image projection apparatus. Each image projection apparatus is disposed in a case 165. The processing apparatus 160 is useful to perform maskless direct patterning.

The controller 190 facilitates the control and automation of the processing techniques described herein. The controller 190 is coupled to or in communication with one or more of the processing apparatus 160, the one or more stages 130, and the encoder 126. The processing apparatus 160 and the one or more stages 130 provide information to the controller regarding the substrate processing and alignment. For example, the processing apparatus 160 provides information to the controller 190 to alert the controller 190 that substrate processing is complete.

The controller 190 includes a central processing unit (CPU) 192, memory 194, and support circuits (or I/O) 196. The CPU 192 is one of any form of computer processors used in industrial settings for controlling various processes and hardware (e.g., pattern generators, motors, and other hardware) and/or monitoring the processes (e.g., processing time and substrate position). The memory 194 is connected to the CPU 192. The memory 194 is one or more of a readily available memory, such as random access memory (RAM), read only memory (ROM), floppy disk, hard disk, or any other form of digital storage, local or remote. Software instructions and data are coded and stored within the memory 194 for instructing the CPU 192. The support circuits 196 are also connected to the CPU for supporting the processor in a conventional manner. The support circuits include conventional cache, power supplies, clock circuits, input/output circuitry, subsystems, and the like. A program (or computer instructions), which may be referred to as an imaging program, is readable by the controller determines which tasks are performable on a substrate. The program is software readable by the controller and includes code to monitor and control, for example, the processing time and substrate position.

During operation, the stage 130 moves in the X-direction from a loading (first) position, as shown in FIG. 1, to a processing (second) position. The processing position is one or more positions of the stage 130 as the stage 130 passes under the processing unit 164. During operation, the stage 130 is be lifted by a plurality of air bearings (not shown) and the stage 130 moves while lifted along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system (not shown) measures the X and Y lateral position coordinates of each of the stage 130 in real-time so that each of the plurality of image projection apparatuses can accurately locate the patterns being written in a photoresist-covered substrate 140. The metrology system also provides a real-time measurement of an angular position of the stage 130 about the vertical or Z-axis. The angular position measurement may be used to hold the angular position of the stage 130 constant during scanning by means of a servo mechanism (not shown), or the angular position measurement may be used to apply corrections to the positions of the patterns being written on the substrate 140 by the image projection apparatus 200A and 200B, shown in FIGS. 2A-2B and discussed below. In some examples, these techniques may be used in combination.

Figure 1B:
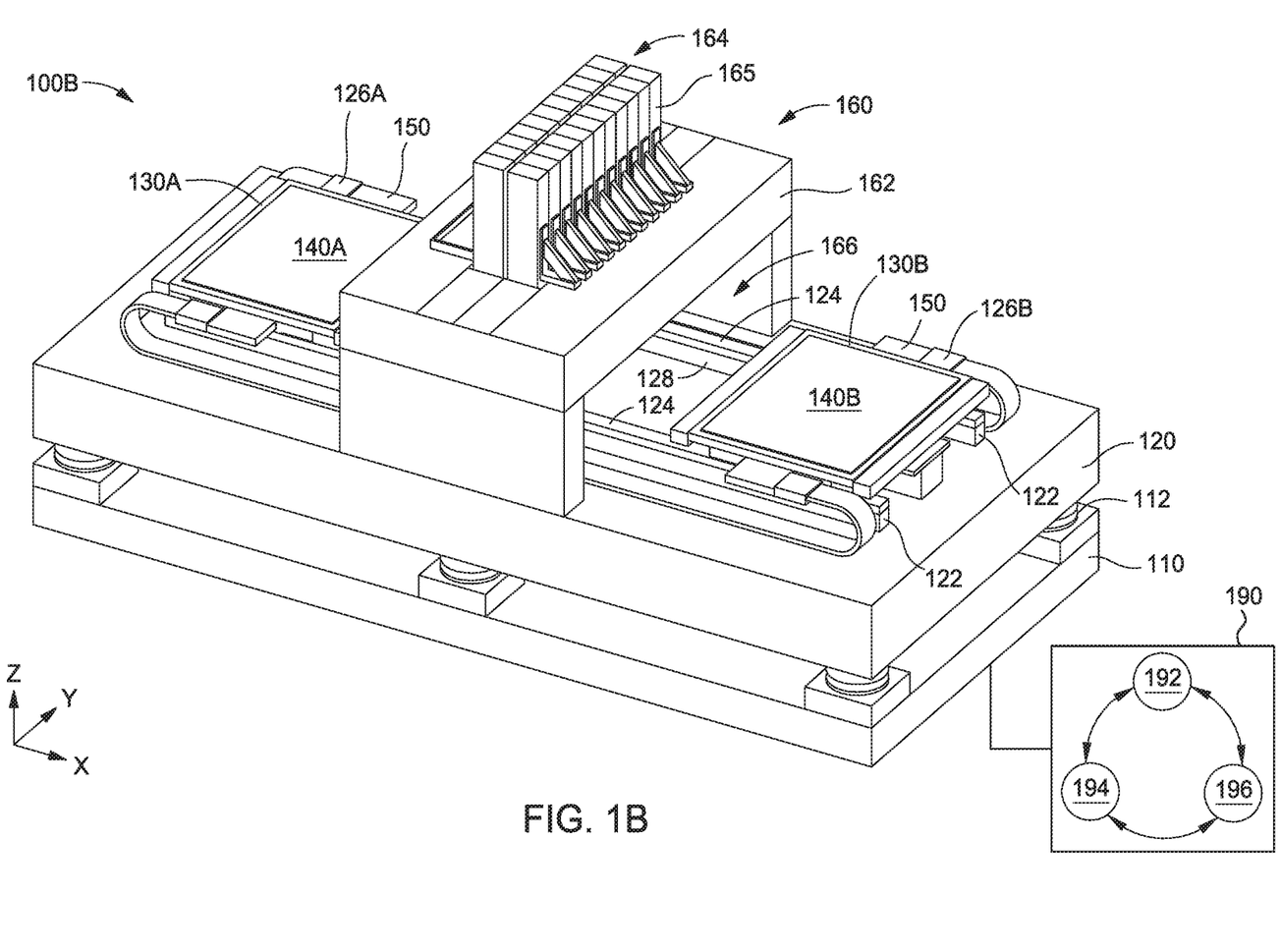
FIG. 1B is a perspective view of a photolithography system according to embodiments disclosed herein.

FIG. 1B is a perspective view of a photolithography system 100B according to embodiments disclosed herein. The system 100B is similar to the system 100A; however, the system 100B includes two stages 130A and 130B. Each of the two stages 130A and 130B is capable of independent operation such that the system can scan a substrate 140A or 140B in a first direction and step in a second, other direction. In some embodiments, when one of the two stages 130A or 130B is scanning a substrate 140, the other of the two stages 130A or 130B is unloading an exposed substrate and loading the next substrate to be exposed. In one example, the first stage 130A scans the substrate 140A, and the second stage 130B unloads an exposed substrate 140B and loads the next substrate (not shown) to be exposed. Also shown in FIG. 1B are the first and second encoders 126A and 126B, respectively co-located with stages 130A and 130B.

While FIGS. 1A-1B each depict an embodiment of a photolithography system (100A and 100B, respectively), other systems and configurations are also contemplated herein. For example, photolithography systems including any suitable number of stages (e.g., 3 or more stages 130) are also contemplated.

Figure 2A:
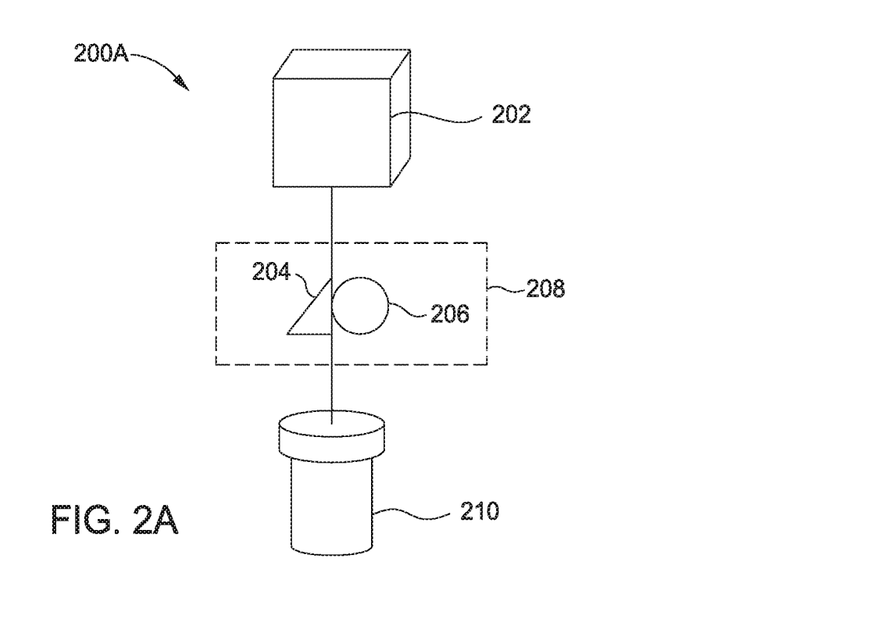
FIG. 2A is a perspective schematic view of an image projection apparatus according to embodiments disclosed herein.

FIG. 2A is a perspective schematic view of an image projection apparatus 200A according to one embodiment. The image projection apparatus 200A may be useful for a photolithography system, such as system 100A or 100B in FIGS. 1A and 1B. The image projection apparatus 200A includes one or more spatial light modulators 202, an alignment and inspection system 208 including a focus sensor 204 and a camera 206, and a plurality of projection optics 210. The components of the image projection apparatus 200A may vary depending on a type of spatial light modulator 202 being used. Spatial light modulators 202 include, but are not limited to, microLEDs, VCSELs, any solid state emitters of electromagnetic radiation, digital micromirror devices (DMDs) and liquid crystal displays (LCDs).

In operation, the spatial light modulator 202 is used to emit light and/or modulate one or more properties of the light, such as an amplitude, a phase, or a polarization of the light, which is projected through the image projection apparatus 200A and to a substrate, such as the substrate 140 in FIG. 1A. The alignment and inspection system 208 is used for alignment and inspection of the components of the image projection apparatus 200A. In one embodiment, the focus sensor 204 includes a plurality of lasers which are directed through the lens of the camera 206 and then back through the lens of the camera 206 and imaged onto sensors to detect whether the image projection apparatus 200A is in focus. The camera 206 is used to image the substrate, such as substrate 140, including to ensure the alignment of the image projection apparatus 200A and photolithography system 100A or 100B is correct or within an predetermined tolerance. The projection optics 210, such as one or more lenses, are used to project the (modulated or unmodulated) light onto the substrate, such as the substrate 140.

Figure 2B:
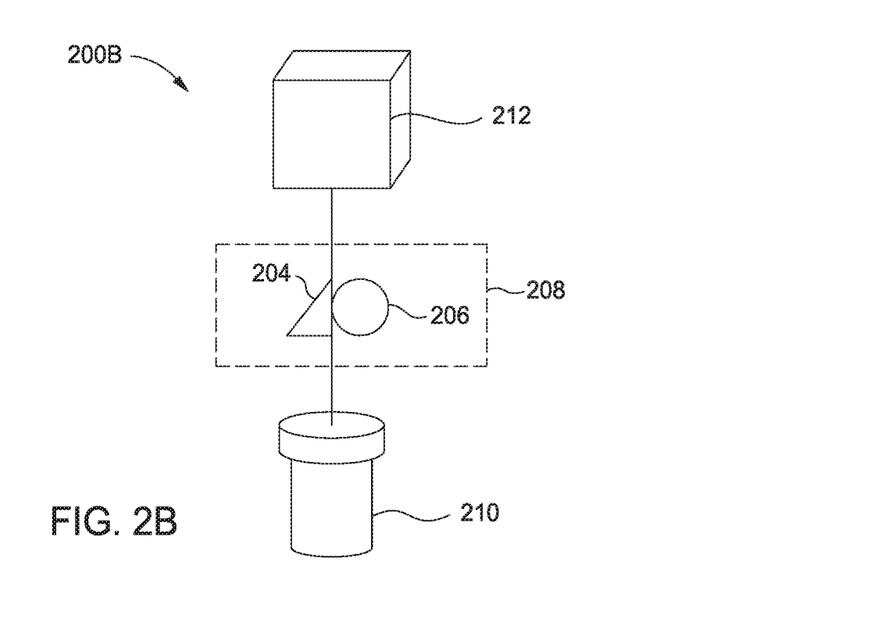
FIG. 2B is a perspective schematic view of an image projection apparatus according to embodiments disclosed herein.

FIG. 2B is an image project apparatus 200B according to embodiments described herein. In the embodiment shown in FIG. 2B, the image projection apparatus 200B includes a solid state emitter device 212 as the spatial light modulator(s), a focus sensor and camera system 208 and projection optics 210. In one embodiment, the image projection apparatus 200B further includes a beamsplitter (not shown).

Figure 3:
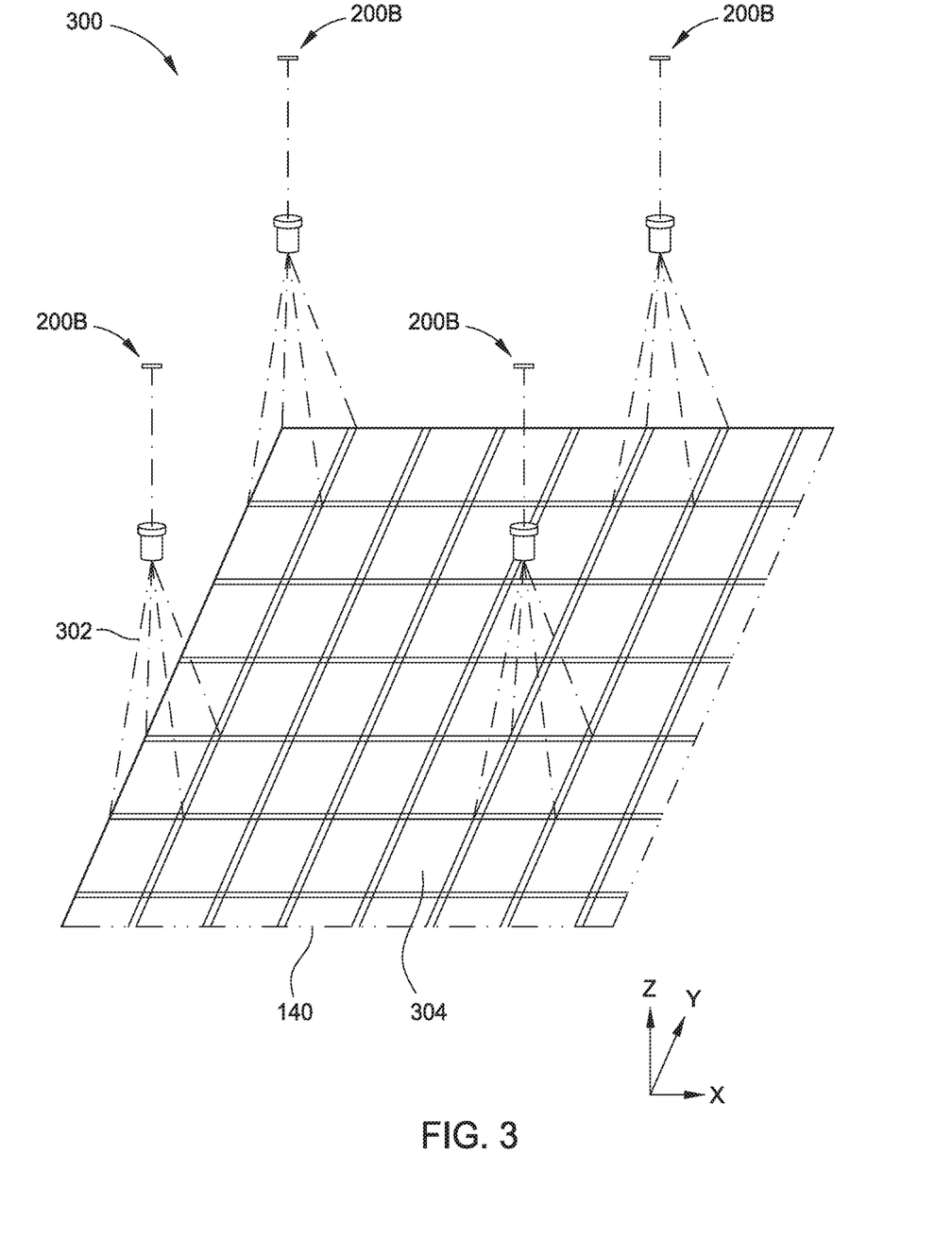
FIG. 3 is perspective view of a plurality of image projection apparatus of FIG. 2B according to embodiments disclosed herein.

FIG. 3 illustrates a schematic view 300 of a plurality of image projection apparatuses 200B. The plurality of image projection apparatuses 200B may be used in a photolithography system, such as systems 100A and 100B. In operation, each image projection apparatus 200B produces a plurality of write beams 302 onto a surface 304 of the substrate 140. As the substrate 140 moves in the X-direction and/or the Y-direction, as indicated by the coordinate system in FIG. 3, the entire surface 304 (across a substrate 140 from edge to edge) is patterned by the write beams 302. In various embodiments, the number of image projection apparatuses 200B included in the system varies based on factors such as the size of the substrate 140 and/or the speed of the one or more stages 130 (as shown in FIGS. 1A and 1B).

Figure 4:
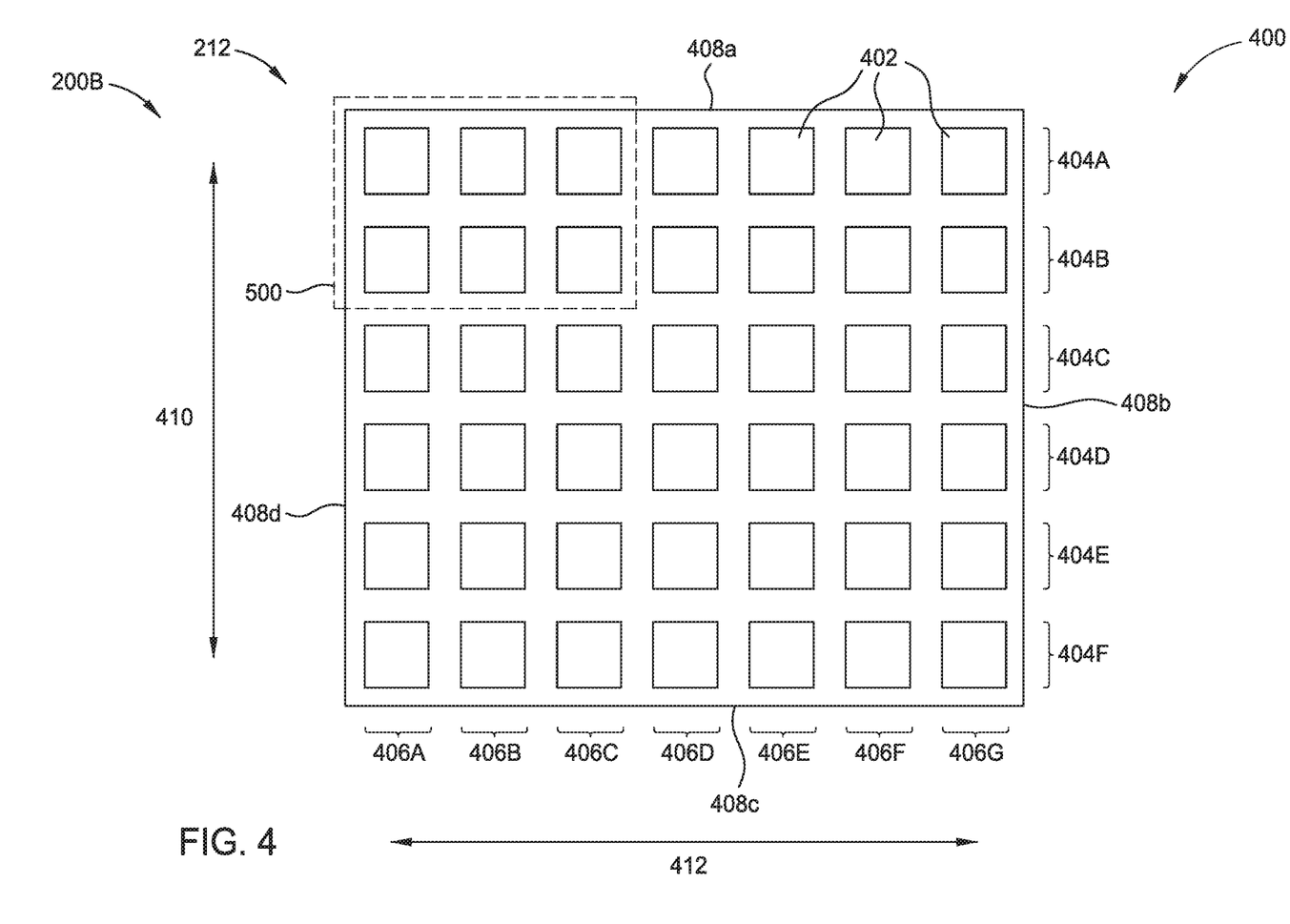
FIG. 4 is a partial top view of a solid state emitter device according to embodiments disclosed herein.

Turning to FIG. 4, an example 400 of a solid state emitter device 212 is shown. As shown in FIG. 4, the solid state emitter device 212 includes a plurality of solid state emitters 402 in an array. Since solid state emitters are self-emitting, an outside light source is not included in the image projection apparatus 200B that illustrates the solid state emitter device 212. Additionally, unlike DMD micromirrors which are configurable between an "on" and "off" state, each solid state emitter has a variable intensity which enables an enhanced grayscale controllability. The device 212 may comprise 4 sides, which may be referred to as "edges" herein. The "edge" is a physical boundary of the substrate, and each device 212 may comprise four edges, a first edge 408a, a second edge 408b, a third edge 408c, and a fourth edge 408d. In some examples, the first edge 408a may be referred to as a "north" edge, the second edge 408b may be referred to as a "west" edge 408b, the third edge 408c may be referred to as a "south" edge 408c, and the fourth edge 408d may be referred to as an "east" edge 408d. Thus, references to the "north-south" adjustability or directionality references a direction 410 from 408a to 408c (and 408c to 408a), and references to "east-west" adjustability of directionality references a direction 412 from 408b to 408d (and 408d to 408b). The east-west adjustability discussed herein refers to the tunability of a voltage that is applied to the device 212 as well as the tunability of a gate bias (which may be set to 0 or to greater than 0). In one example, as substrate moves from the edge 408d to the edge 408b, and both the substrate and device 212 are substantially the same shape if not the same size, a plurality of "stripes" are formed when the voltage is received by some of the emitters from the device 212. By providing different amounts of voltage to rows along the edges 408a, 408b, 408c, and 408d through a common rail, the intensity and brightness of the edge-located columns may be less than those towards the center of the device 212. Each solid state emitter 402 has a gate (ground) that can be set to 0, so the diff between the voltage applied in a pulse and the ground dictates the brightness of the emitter. Thus, either or both of the voltage applied to the device 212 or the bias on the gates (grounding) can be applied to attenuate the brightness. A subset 500 of solid state emitters is shown in FIG. 4 and discussed and used below at FIGS. 5A and 5B.

The solid state emitters 402 are arranged in an array comprising a plurality of rows 404A-404F and a plurality of columns 406A-406G. While six rows and seven columns are shown in FIG. 4 as an example, in other embodiments, a solid state emitter device 212 may include millions of solid state emitters 402, each of which corresponds to a pixel in a display. For example, one embodiment of a solid state emitter device has a size of 1024 by 2048 pixels. In one example, using a common rail associated with each row 404A-404F, a pulse of for 404C may have a higher intensity and/or longer duration than a pulse applied to row 404B, and the pulse applied to row 404B may have a higher intensity and/or longer duration than a pulse applied to row 404A at the north edge 408a of the device 212. Similarly, when solid state emitters are associated with a common row by column, a pulse applied to column 406E may comprise a higher intensity and/or longer duration than the pulse applied to column 406F, which may be of a higher intensity and/or longer duration than that applied to column 406G since the column 406G is along the edge 408b of the device 212. The attenuation of the pulses applied to the device 212 as the edge(s) are approached causes the desired field stitching and related blending/fading at the edges in either or both of the directions 410 and 412.

Figure 5A:
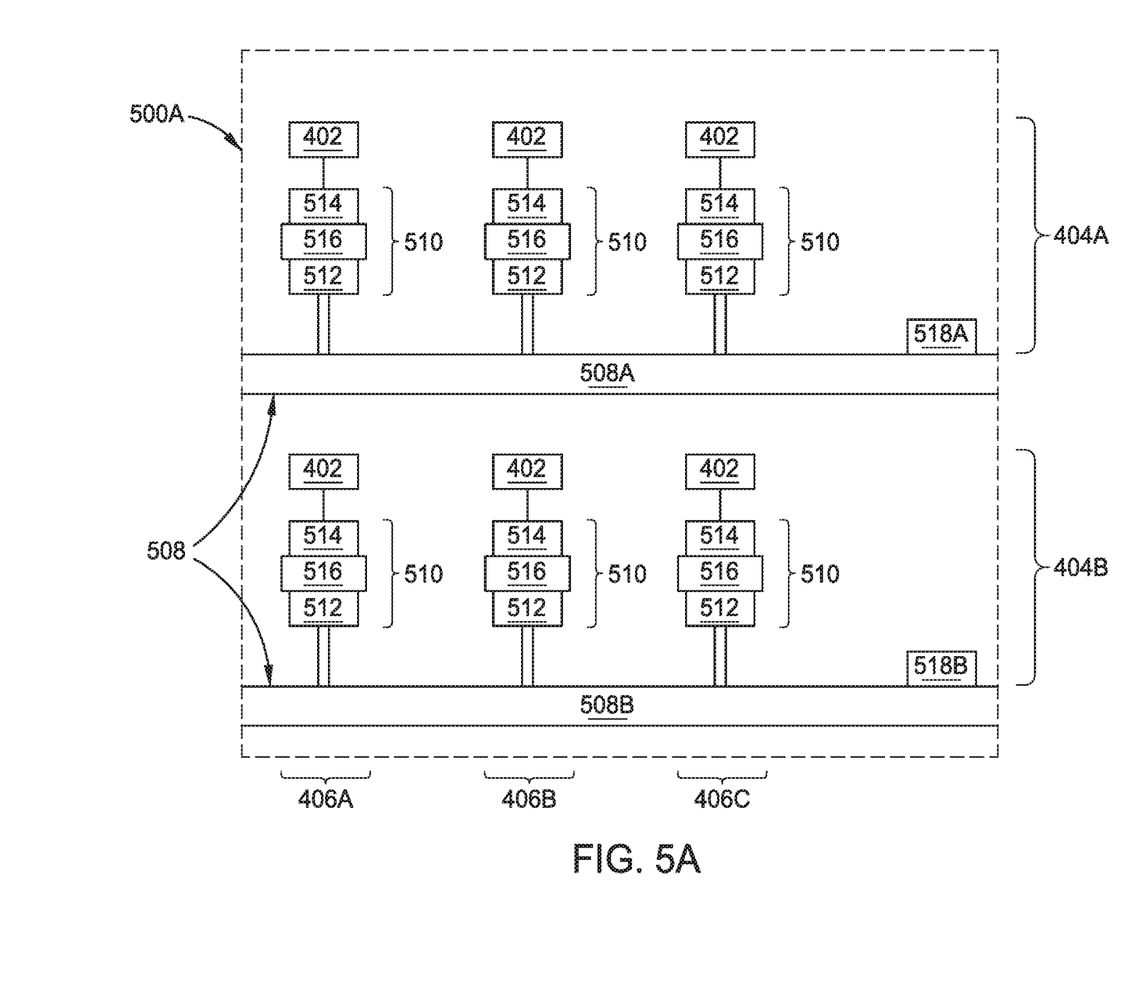
FIG. 5A is a partial side view of a portion of the solid state emitter device of FIG. 4 according to embodiments disclosed herein.

FIG. 5A is an enlarged view of a circuit diagram of a portion 500A of the solid state emitter device 212 from the portion 500 in FIG. 4. As shown in FIG. 5A, in a first configuration of the array, each solid state emitter 402 is associated with and electrically coupled to a transistor 510. Each transistor 510 includes a source 512, a drain 514, and a gate 516. While a single gate 516 is illustrated herein, it may, in some examples, represent two or more gates 516 associated with a transistor 510 single solid state emitter. Any number of transistors 510 may be supported by a common rail 508 along a row or column of the solid state emitter array. Using a common rail 508 for all transistors in a given row is one embodiment contemplated by the present disclosure. In another embodiment, a common rail is used to support all transistors in a given column. In yet another embodiment, a common rail is used to support a group of adjacent transistors from multiple rows and columns. Additionally, the foregoing contemplates a solid state emitter device having an array of solid state emitters; however, other self-emitting devices are also contemplated herein. In some examples, additional transistors (not shown) may be electrically and/or mechanically coupled to each rail which is configured to receive pulses from a pulsing source (not shown) to turn on each rail.

As shown in FIG. 5A, a first common rail 508A is used to supply current to all of the transistors 510 in row 404A and a second common rail 508B is used to supply current to all (each) of the transistors 510 in row 404B. This configuration may be used throughout the solid state emitter device 212 such that each row of solid state emitters 402, for example rows 404A-404F, of solid state emitters 402 is supported by a corresponding common power rail 508. Each common rail 508A and 508B may be further coupled to a rail transistor 518A, 518B, respectively, and each transistor 518A and 518B may be configured to receive a plurality of pulses from the pulsing source (not shown) and transmit those pulses to the solid state emitters coupled to that rail.

As discussed above, multiple image project apparatuses, such as image project apparatus 200B discussed in FIG. 2B, are used together to pattern large area substrates such as display devices. Each apparatus 200B comprises at least one spatial light modulator, such as a solid state emitter device 212, For example, a first image projection apparatus with a first solid state emitter device, such as solid state emitter device 212, will make a first pass over the at least a first portion of a target substrate to provide an exposure dose and to pattern the first portion. Subsequently, the first image projection apparatus will be stepped down, in carriage-return fashion, to make a second pass over at least a second portion of the target substrate to pattern the second portion. The second pass is generally in a direction opposite to the direction of the first pass, for example, the first pass is from right to left over a target substrate and the second pass, which is stepped down from the first pass, is from left to right over the same target substrate. At the same time, a second, different image projection apparatus, such as image projection apparatus 200B, adjacent to the first image projection apparatus, is making similar passes over the substrate. These passes may include patterning portions of the target substrate which were previously patterned by the first image projection apparatus.

According to embodiments of the present disclosure, in operation, the common rail 508A or 508B supplies a signal, such as voltage or current, to the respective row of transistors 510. Since each row 404A-404F of transistors 510 is supported by its own corresponding rail 508, the amount of signal applied to each row 404A-404F of transistors 510 is controllable to allow for brightness attenuation over the surface of the solid state emitter device 212, especially in combination with programs that set various transistors along a common rail to an "on" or an "off" state. The amount of attenuation over the surface of the solid state emitter device 212 is predetermined to compensate for the described overlapping.

In the example operation discussed above, in which multiple image projection systems having at least one solid state emitter device 212 therein are moved in carriage-return like fashion to pattern a substrate, the overlapping regions are those that correspond to areas patterned by the solid state emitters at or near the edge of the solid state emitter device 212. In one example, the solid state emitter device 212 comprises a plurality of microLEDs. Accordingly, the brightness of the rows of solid state emitters near the edge of the array, such as rows 404A, 404B, 404E and 404F (FIG. 4), is attenuated as compared to centrally-positioned rows, such as rows 404C and 404D to reduce or eliminate over exposure in the overlapping regions. For example, the brightness of row 404A and/or 404F may be created by a first pass, and the brightness of row 404B and 404D may be created by a second pass that may be at a higher dose (intensity and/or duration) than the first pass. The combination of the first and the second passes, that is, of the doses (intensity and duration) of the passes, corresponds to an amount that will provide one hundred percent exposure after subsequent passes by the same image projection apparatus or another image projection apparatus as to not overexpose a particular subset (row, column, or other area). Further in embodiments of the present disclosure, the device 212 is a uLED array 212 and passes over a region such as the rows 404A and 404B that the uLED array 212 has previously passed over. In another embodiment, a second uLED array (not shown here) passes over an area such as the rows 404A and 404B that the first uLED array 212 previously passed over (e.g., over an area that was previously exposed). Thus, there may be overlap between passes of the same device 212 over a region of a substrate, as well as overlap between different devices over a region of a substrate.

In one embodiment, to attenuate an entire row of solid state emitters, such as rows 404A-404F, a voltage applied to each row is decreased as the distance of the row from the center of the solid state emitter device 212 increases. For example, the voltage applied by the common rails supporting rows 404C and 404D is 5 volts, the voltage applied by the common rails supporting rows 404B and 404E, such as common rail 508B for row 404B, is 4.9 volts, and the voltage applied by the common rails supporting rows 404A and 404F, such as common rail 508A for row 404A, is 4.8 volts. The decrease in voltage may continue such that the voltage at the outermost rows of the solid state emitters is near zero. By slowly rolling off the voltage across the surface of the solid state emitter device 212, the brightness coming out of the respective row of solid state emitters 212 is decreased to account for subsequent exposure dose. Using this attenuation method, uniform exposure doses are applied at the areas of overlap between multiple passes of the same image projection apparatus. This enables the passes of adjacent image projection apparatus to improve blending, or field stitching, in those overlapping regions, to present a smoothed image on a display to a user or users.

Figure 5B:
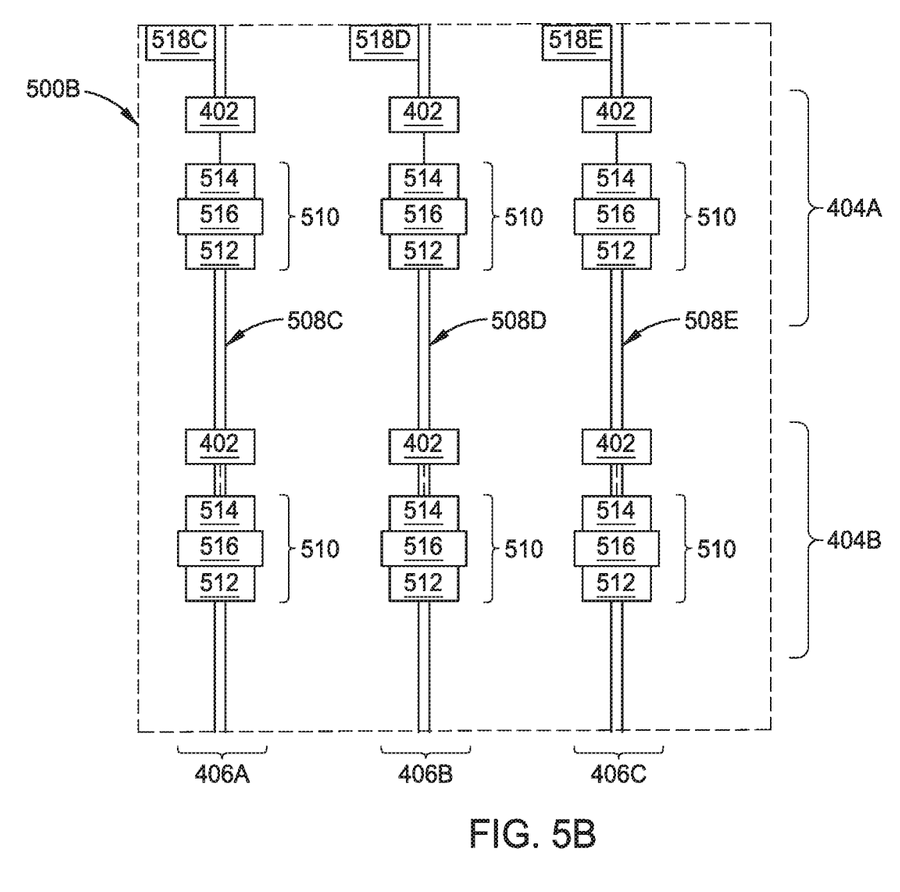
FIG. 5B is a partial side view of a portion of the solid state emitter device of FIG. 4 according to embodiments disclosed herein.

FIG. 5B is an enlarged view of a circuit diagram of a portion 500B of the solid state emitter device 212 from the portion 500 of FIG. 4. In contrast to FIG. 5A where each solid state emitter is coupled to a transistor 510 and a rail 508A or 508B connects multiple transistors along a single row 404A/404B, FIG. 5B illustrates an embodiment where the transistors 510 are connected by common rails for example, to power rails 508C-508E, for each of columns 406A, 406B, and 406C. In FIG. 5B, the first column 406A is associated with the common rail 508C which is coupled to a rail transistor 518C, the second column 406B is associated with the a common rail 508D which is coupled to a rail transistor 518D, and the third column 406C is associated with the a common rail 508E which is coupled to a rail transistor 518E. Further in the example in FIG. 5B, pulses are transmitted to each rail 508C-508E via the corresponding rail transistor 518C-518E, and travel along each rail 508C-508E and current is transmitted to the transistors 510 that are set to an "on" state.

Figure 5C:
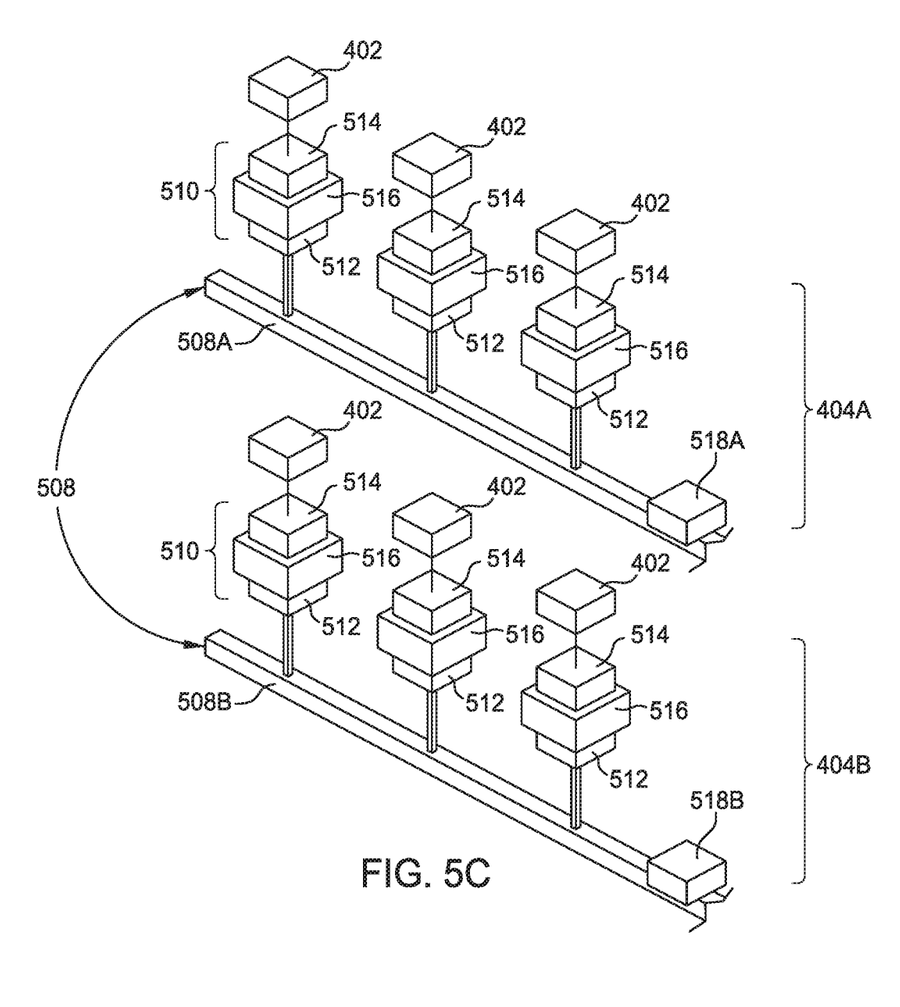
FIG. 5C is an isometric partial side view of a portion of the solid state emitter device of FIG. 5B according to embodiments disclosed herein.

FIG. 5C is an isometric partial side view of a portion of the solid state emitter device of FIG. 5B according to embodiments disclosed herein. FIG. 5C illustrates the first common rail 508A is used to supply current to all of the transistors 510 in row 404A and the second common rail 508B is used to supply current to all (each) of the transistors 510 in row 404B. As discussed above, each row of solid state emitters 402, for example rows 404A-404F, of solid state emitters 402 is supported by a corresponding common power rail 508. Each of the first common rail 508A and the second common rail 508B may be further coupled to a rail transistor 518A, 518B, respectively, and each transistor 518A and 518B may be configured to receive a plurality of pulses from the pulsing source (not shown) and transmit those pulses to the solid state emitters coupled to that rail.

Figure 6:
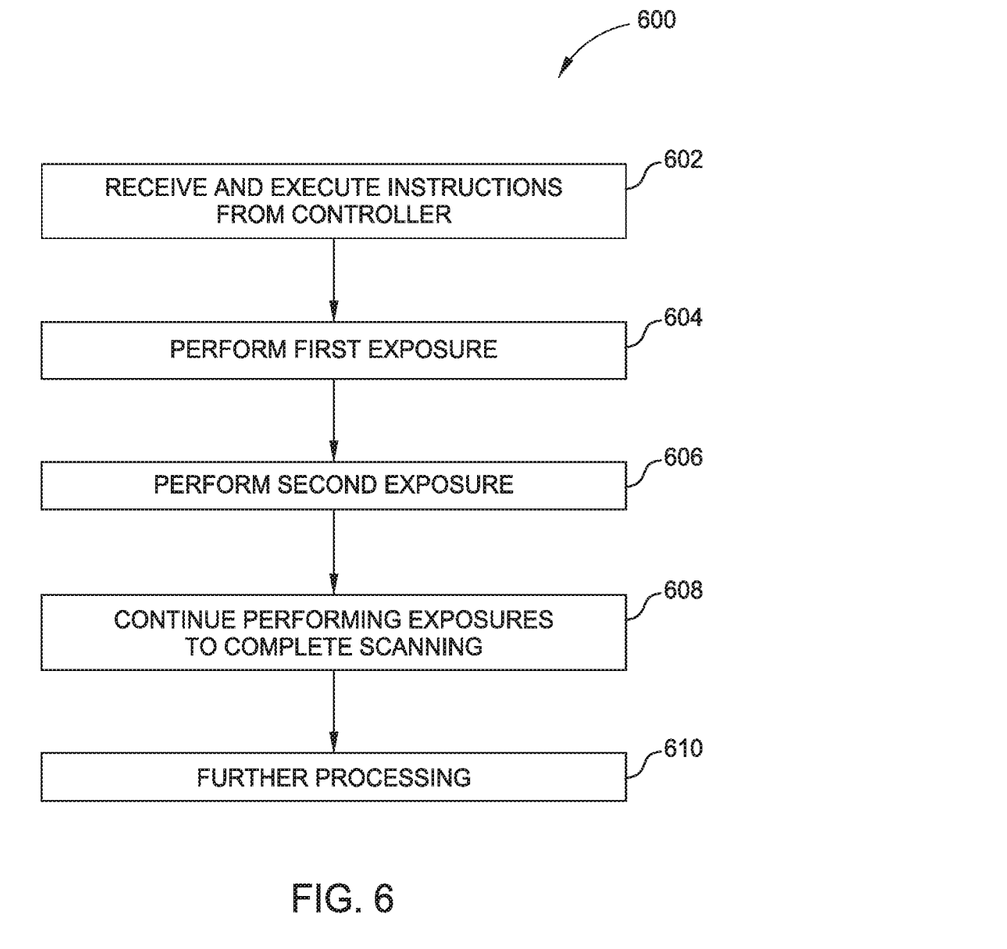
FIG. 6 is a flow chart of a method of using an imaging system according to embodiments disclosed herein.

FIG. 6 is a method 600 using an imaging system, such as that discussed in various embodiments above. The method begins at block 602. At block 602, an imaging component of an imaging system receives instructions, e.g., instructions associated with an imaging program, from a controller 190. The instructions received at block 602 may comprise information associated with which gates of a solid state emitter array of an imaging system are to be set to on and which are to be set to off, an amount (intensity) of a dosage or dosages (voltage) to be applied to individual rows and/or columns via the common rails, and/or a time or times for which the doses are to be applied to each common rail associated with a row or a column. The imaging programs thus define parameters for a series of sequential and/or simultaneous (e.g., when more than one imaging apparatus is used) activations of solid state emitters in the array during one or more passes in order to pattern a target substrate.

In some examples, a clock or other device capable of executing instructions or causing the execution of instructions by a processor in time-based segments may be coupled to the imaging system. The clock (not shown) may be in communication with the imaging system via the controller 190 (FIG. 1) or other system components discussed herein. The imaging programs may employ this clock in the execution of methods discussed herein. In one example, each imaging program comprises a plurality of clock phases or states. A clock phase or state may be defined herein as a duration of time during which a row or column of solid state emitters associated with a common rail are set to either an "on" setting or an "off" setting. During the first phase, the clock determines which solid state emitters of the array are to pass current during a pulse and which are not. Pulses may be sent across an entire array or to portions of an array. In one example, during a "global" pulse, a pulse is sent to an entire array of solid state emitters. A common rail may be associated with a plurality of solid state emitters and thus the gates of those emitters, some of which may be set to a bias of 0 and some of which, along the same common rail, may be set to greater than 0, e.g., 0.5, 1.0, or another setting. Thus, during a global purse of all of the common rails in an array, different voltages may be applied to different common rails. In another example, the same voltage is applied to one or more common rails in a single array and the brightness is attenuated using the bias settings. Block 602 may be referred to as the stage programming block. That is, during block 602, based on an imaging program, each gate of the solid state emitter is automatically associated with an "on" or an "off" state. This association with an on/off state may be based on execution of an imaging program. In addition, at block 602, a gate or gates associated with each solid state emitter is programmed to turn on may also be turned on "biased" or turned off "grounded."

At block 604, based on the instructions received at block 602, a first exposure is performed on a target substrate 140 by applying a pulse to at least one common rail of a solid state emitter array. The first pulse is applied at block 604 for a first time period (duration) at a first intensity (voltage). A pulse may be defined as having a starting point and an end point, where the starting point and end point has a duration therebetween. In various examples, the duration may be as short as a few nanoseconds or shorter to as long as a period of days, weeks, or longer. Exposing the substrate 140 may form a pattern on the substrate 140 to expose a photoresist on the substrate 140. Each exposure may last between approximately about 6 nanoseconds and about 85 microseconds, for example between about 5 microseconds and about 75 microseconds. For example, the controller 190 may pulse each gate in a common rail in the on or off state to allow the current to flow from the source to the drain, when the current is flowing from the source to the drain, the state is in an "on" setting for at least one gate associated with that drain, which enables the exposure of the first portion of the substrate 140. Each row or each column of solid state emitters is connected by a common rail. The target substrate may be processed (scanned) in a north-south direction (by row) or in an east-west direction (by column), depending upon the embodiment, by applying sequential pulses to the common rails of the solid state emitter array.

In some embodiments, during a global pulse at block 604, the current generated would move from the current generation source under each gate (of each transistor coupled to the solid state emitters) to each drain and then to each pixel. In some examples, each pixel is associated with two or more transistors. In this example, each transistor may be associated with a different gate, and each different gate may have a different size. Further to this example, a plurality of states or levels or states may be stored in the imaging program loaded at block 602 such that at a first level of a first imaging program, when a pulse is applied to an entire array, some but not all of a first set of gates of each transistor in a row or column are turned off and the other gates are turned on, at a second level of the same imaging program, a second set of gates for each transistor in the row or column are turned, and, at a third level, both the first and the second gates of each transistor in the row or column are turned on.

At block 606, the substrate 140 is translated a step size (e.g., there is a carriage return), and a second portion of the substrate 140 is exposed when a second pulse is applied to the solid state emitter array. The second pulse may be applied to a second common rail of a row or a column, depending upon the first pulse. That is, if the first pulse is applied to a common rail of a row, the second pulse may also be applied to a second common rail associated with a row of solid state emitters. Similarly, if the first portion is a column, the second portion may also comprise a row. If the first pulse is applied to a common rail of a column, the second pulse may also be applied to a second common rail associated with a second column of solid state emitters. In one embodiment, the second pulse comprises a second voltage it that is less than the first voltage applied in the first pulse at block 604, and the second common rail is closer to an edge of the substrate than the first common rail.

In another embodiment, the second common rail has the second voltage applied to it for a second duration that is less than the first duration at block 604, and the second common rail is closer to an edge of the substrate than the first common rail. In various embodiments, the exposure at block 604 comprises a different voltage than that at block 606, and in other embodiments the exposure at block 604 comprises a different time period than the exposure at block 606, and in still other embodiments, both the exposure voltages and time periods between the first and the second common rails (exposures) are different.

In various embodiments, each exposure may last between approximately about 6 nanoseconds and about 85 microseconds, for example between about 5 microseconds and about 75 microseconds. The intensity of the doses applied may range from 100 mV to 7 V. For example, the controller 190 may pulse each solid state emitter in the on state to expose the first portion of the substrate 140. In some embodiments, rather than the substrate 140 being translated a step size, the imaging system may be translated a step size, while the substrate 140 and related stage to which the substrate 140 is coupled remains stationary.

At block 608, the translating the substrate a step size (carriage return) and exposing the substrate by pulsing solid state emitters via common rails is repeated iteratively until the target substrate is fully processed. A "full" or "complete" processing of a substrate refers to the completed execution of an imaging program, such that the substrate is properly configured for further processing which may include packaging or quality/regulatory processes (not illustrated here). Each exposure (subsequent pass) may generate a data set relating to a fading or a blending the substrate 140. Each data set may be stored in the memory of the controller. Each data set may be combined to form the image pattern on the substrate 140. Each exposure may form an aerial image of a portion of the substrate 140 and these images may be stored on the imaging system for real-time or later analysis for quality and efficiency improvement. Subsequent to block 608, additional processing operations may be performed on the target substrate at block 610, these operations may include further fabrication, packaging, assembly, cleaning, or other operations.

While the foregoing is directed to examples of the present disclosure, other and further examples of the disclosure may be devised without departing from the basic scope thereof, and the scope thereof is determined by the claims that follow.

What is claimed is:

1. An imaging system comprising:
   a solid state emitter device, comprising:
      a plurality of solid state emitters arranged in an array comprising a plurality of rows and a plurality of columns;
      a plurality of transistors, each transistor of the plurality of transistors being coupled to a solid state emitter of the plurality of solid state emitters in the array; and
      a plurality of common power rails including at least a first common power rail and a second common power rail, wherein the first common power rail is electrically coupled to a first subset of transistors of the plurality of transistors, and wherein the second common rail is electrically coupled to a second subset of transistors of the plurality of transistors; and
   a plurality of imaging programs stored in a non-transitory memory of the imaging system and configured, when executed by a processor, to transmit a plurality of pulses to the solid state emitter device, wherein, in a first state of the device associated with a first imaging program of the plurality of imaging programs, each transistor in the first subset of transistors is associated with an "on" state, and in a second state of the device, associated with the first imaging program of the plurality of imaging programs, fewer than all of the transistors in the first subset of transistors are associated with an "on" state.

2. The system of claim 1, wherein the first subset of transistors is distinct from the second subset of transistors.

3. The system of claim 1, wherein at least some of the transistors of the first subset are also included in the second subset.

4. The system of claim 1, further comprising a transistor coupled to each common rail and configured to receive a plurality of pulses from a pulsing source.

5. The system of claim 1, wherein each transistor comprises a source, a drain, and a plurality of gates.

6. An imaging system, comprising:
a plurality of imaging programs stored in a non-transitory memory of the system and executable by a processor;
a plurality of solid state emitters arranged in an array comprising a plurality of rows and a plurality of columns;
a plurality of transistors, each transistor of the plurality of transistors coupled to one of the plurality of solid state emitters;
a plurality of common rails, wherein each common rail of the plurality of common rails is coupled to a subset of solid state emitters of the plurality of solid state emitters; and
a pulsing source electrically coupled to the array and configured to, in response to execution of an imaging program of the plurality of imaging programs by the processor, transmit a plurality of sequential pulses to the plurality of common rails, wherein each pulse of the plurality of sequential pulses is associated with an intensity and a duration.

7. The system of claim 6, further comprising a rail transistor coupled to each common rail and configured to receive the plurality of pulses.

8. The system of claim 6, wherein each transistor of the plurality of transistors comprises a source, a drain, and a plurality of gates.

9. The system of claim 8, wherein, in a first state of the system, a first gate of the plurality of gates of a common rail is set to an off state and a second gate of the plurality of gates is set to an on state, and wherein in a second state of the system, the first gate and the second gate are both set to an on state.

10. The system of claim 6, wherein the pulsing source is further configured to transmit pulses of different voltages to the plurality of common rails such that at least one common rail of the plurality of common rails receives a different voltage than at least one adjacent common rail.

11. The system of claim 6, wherein a first common rail is coupled to a plurality of transistors in a row at an edge of the device and a second common rail is coupled to a plurality of transistors in a row further from an edge of the device than the first row, wherein the first common rail receives a first pulse with a first voltage and a first duration and the second common rail receives a second pulse with a second voltage and a second duration, wherein at least one of the first voltage is less than the second voltage or the first duration is shorter than the second duration.

12. The system of claim 6, wherein a first common rail is coupled to a plurality of transistors in a first column at an edge of the device and a second common rail is coupled to a plurality of transistors in a second column further from the edge than the first column and adjacent to the first column, wherein the first common rail receives a first pulse with a first voltage and a first duration and the second common rail receives a second pulse with a second voltage and a second duration, wherein at least one of the first voltage is less than the second voltage or the first duration is shorter than the second duration.

13. A method for using a solid state emitter device, comprising:
transmitting, by a pulse source of an imaging system in response to execution of an imaging program by a processor, a first pulse to a first common rail of a plurality of common rails of a solid state emitter array using a first voltage for a first duration, wherein the first common rail is associated with a first subset of solid state emitters, wherein the first common rail transmits the pulse to the first subset of solid state emitters; and
subsequent to transmitting the first pulse, transmitting, by the pulse source, based on the imaging program, a second pulse to a second common rail of the plurality of common rails using a second voltage for a second duration, wherein the second common rail is associated with a second subset of solid state emitters, wherein the second common rail transmits the pulse to the second subset of solid state emitters.

14. The method of claim 13, wherein the solid state emitter array comprises a plurality of outer edges and the second subset of solid state emitters is closer to an edge of the array of solid state emitters than the first subset.

15. The method of claim 14, wherein at least one of the first voltage is higher than the second voltage or the first duration is longer than the second duration.

16. The method of claim 13, further comprising:
setting, based on a clock coupled to the system, prior to transmitting the first pulse, a plurality of transistors associated with each solid state emitter, to either an "on" setting or an "off" setting based upon a first clock phase, wherein each transistor of the plurality of transistors is coupled to a common rail;
transmitting the first pulse during a second clock phase; and
transmitting the second pulse during a third clock phase.

17. The method of claim 13, wherein each subset of solid state emitters associated with a common rail comprises a row of solid state emitters of the solid state emitter array.

18. The method of claim 13, wherein each subset of solid state emitters associated with a common rail comprises a column of solid state emitters of the solid state emitter array.

* * * * *